(12) United States Patent
Han et al.

(10) Patent No.: US 10,424,630 B2
(45) Date of Patent: Sep. 24, 2019

(54) ORGANIC LIGHT EMITTING DIODE DISPLAY

(71) Applicant: LG DISPLAY CO., LTD., Seoul (KR)

(72) Inventors: Joonsoo Han, Paju-si (KR); Jeonghyeon Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/046,515

(22) Filed: Jul. 26, 2018

(65) Prior Publication Data
US 2019/0035874 A1 Jan. 31, 2019

(30) Foreign Application Priority Data

Jul. 31, 2017 (KR) .......................... 10-2017-0097225

(51) Int. Cl.
*H01L 27/32* (2006.01)
*G09G 3/3233* (2016.01)
*H01L 27/12* (2006.01)
*G09G 3/3225* (2016.01)

(52) U.S. Cl.
CPC ....... *H01L 27/3276* (2013.01); *G09G 3/3233* (2013.01); *H01L 27/3213* (2013.01); *H01L 27/3218* (2013.01); *H01L 27/3248* (2013.01); *H01L 27/3262* (2013.01); *G09G 3/3225* (2013.01); *G09G 2300/0819* (2013.01); *G09G 2300/0842* (2013.01); *G09G 2310/0251* (2013.01); *G09G 2310/0262* (2013.01); *G09G 2330/10* (2013.01); *H01L 27/124* (2013.01); *H01L 27/1255* (2013.01); *H01L 27/3265* (2013.01)

(58) Field of Classification Search
None
See application file for complete search history.

(56) References Cited

U.S. PATENT DOCUMENTS

2013/0234144 A1* 9/2013 Seo .................. H01L 27/124
257/72
2015/0108482 A1* 4/2015 Kim .................. H01L 27/3276
257/71
2015/0355517 A1* 12/2015 Huang .............. H01L 27/1244
257/72

FOREIGN PATENT DOCUMENTS

KR  10-2005-0066639 A  6/2005
KR  10-2016-0060198 A  5/2016

* cited by examiner

*Primary Examiner* — Benjamin P Sandvik
(74) *Attorney, Agent, or Firm* — Birch, Stewart, Kolasch & Birch, LLP

(57) ABSTRACT

An organic light emitting diode display is provided, which selectively disconnects one section of a scan line to darken a defective pixel when a defect occurs in a pixel provided with Thin Film Transistors (TFTs). The organic light emitting diode display includes four subpixel regions arranged in a 2×2 matrix on a substrate, a first horizontal scan line, a second horizontal scan line, a first vertical scan line, and a second vertical scan line. The first horizontal scan line passes through first and third subpixel regions. The second horizontal scan line passes through second and fourth subpixel regions. The first vertical scan line and the second vertical scan line connect the first horizontal scan line and the second horizontal scan line.

13 Claims, 5 Drawing Sheets

ORGANIC LIGHT EMITTING DIODE DISPLAY

This application claims the priority benefit of Korean Patent Application No. 10-2017-0097225 filed in the Republic of Korea on Jul. 31, 2017, which is incorporated herein by reference for all purposes as if fully set forth herein.

BACKGROUND OF THE INVENTION

Field of the Invention

The present invention relates to an organic light emitting diode display and, more particularly, to an organic light emitting diode display which selectively disconnects one section of a scan line to darken a defective pixel when a defect occurs in a pixel provided with thin film transistors (TFTs).

Discussion of the Related Art

Various flat panel display that can reduce the weight and size which were disadvantages of a cathode ray tube have been developed. The flat panel display device includes a liquid crystal display (LCD), a field emission display (FED), a plasma display panel (PDP), an electroluminescence device (EL), and the like.

The electroluminescence device is broadly classified into an inorganic electroluminescence device and an organic electroluminescence device by a material of a luminous layer thereof. The electroluminescence device is a self-luminous device which emits light on its own, and has an advantage in that its response speed is fast and its luminous efficiency, brightness and viewing angle are high. In particular, there is an increasing demand for an organic light emitting diode display which exhibits excellent energy efficiency, creates less current leakage, and is easy to represent grayscales by adjusting currents.

If the organic light emitting diode display is used for a long time, its display quality can be degraded due to a change in the electrical characteristics of a pixel. Thus, compensation means capable of detecting a change in the electrical characteristics of a pixel and compensating for the change is needed. If such compensation means and/or circuit is mounted directly in the pixel, this can reduce an opening ratio which indicates an occupancy ratio of an emission region in the pixel.

In addition, due to the development of a large-screen and/or a super-resolution structure, a pixel size for the organic light emitting diode display has been being reduced, and a high opening-ratio structure which increases a ratio of an opening region in a pixel is required. Since the number of pixels is increased for super resolution, the probability of a pixel defect is increased as well. In response to a pixel defect, the pixel can be darkened so that a user does not recognize the defect. Considering all of these situations, it is important to develop a structure which helps to secure a high opening ratio in a large-screen and/or a super-resolution organic light emitting diode display.

SUMMARY OF THE INVENTION

The present invention provides an super-resolution organic light emitting diode display with a high opening ratio. In order to darken a defective pixel on a rear surface of a substrate, the embodiments of the present invention provide an organic light emitting diode display which minimizes a margin area for darkening by disconnecting part of a scan line close to the rear surface to thereby secure a high opening ratio. The embodiments of the present invention provide an organic light emitting diode display which maintains connectivity of a scan line disposed at any one subpixel even though one section of the scan line is selectively disconnected.

The organic light emitting diode display according to an embodiment of the present invention includes four subpixel regions arranged in a 2×2 matrix on a substrate, a first horizontal scan line, a second horizontal scan line, a first vertical scan line, and a second vertical scan line. A first subpixel region is positioned at (1,1). The second subpixel region is positioned at (2,1). The third subpixel region is positioned at (1,2). The fourth subpixel region is positioned at (2,2). The first horizontal scan line passes through the first and third subpixel regions. The second horizontal scan line passes through the second and fourth subpixel regions. The first vertical scan line and the second vertical scan line connect the first horizontal scan line and the second horizontal scan line.

For example, the first vertical scan line can be disposed along left side edges of the first and second subpixel regions, and the second vertical scan line can be disposed along right side edges of the third and fourth subpixel regions.

For example, the organic light emitting diode display further includes a scan line, a first data line, a second data line, a third data line, a fourth data line, a driving current line, a first horizontal driving current line, and a second horizontal driving current line. The scan line can be connected to one of the first and second horizontal scan lines and extending in a transverse direction on the substrate. The first data line mat be disposed on left side edges of the first and second subpixel regions on the substrate. The second data line can be disposed on right side edges of the first and second subpixel regions. The third data line can be disposed on left side edges of the third and fourth subpixel regions. The fourth data line can be disposed on right side edges of the third and fourth subpixel regions. The driving current line can be disposed in an outer side of one of the first and fourth data lines. The first horizontal driving current line can be connected to the driving current line and extend to the first and third subpixel regions. The second horizontal driving current line can be connected to the driving current line and extend to the second and fourth subpixel regions.

For example, the organic light emitting diode display according to an embodiment of the present invention further includes a first switching thin film transistor (TFT), a second switching TFT, a third switching TFT, and a fourth switching TFT. The first switching TFT can be connected to the first data line and the first horizontal scan line and disposed in the first subpixel region. The second switching TFT can be connected to the second data line and the second horizontal scan line and disposed in the second subpixel region. The third switching TFT can be connected to the third data line and the first horizontal scan line and disposed in the third subpixel region. The fourth switching TFT can be connected to the fourth data line and the second horizontal scan line and disposed in the fourth subpixel region.

For example, the organic light emitting diode display according to an embodiment of the present invention further includes first cutting portions, second cutting portions, third cutting portions, and fourth cutting portions. The first cutting portions can be defined in left and right sides of the first switching TFT on the first horizontal scan line in the first subpixel region. The second cutting portions can be defined in left and right sides of the second switching TFT on the second horizontal scan line in the second subpixel region. The third cutting portions can be defined in left and right sides of the third switching TFT on the first horizontal scan line in the third subpixel region. The fourth cutting portions can be defined in left and right sides of the fourth switching TFT on the second horizontal scan line in the fourth subpixel region.

For example, the organic light emitting diode display according to an embodiment of the present invention further includes a first driving TFT, a second driving TFT, a third driving TFT, and a fourth driving TFT. The first driving TFT can be connected to the first switching TFT and the first horizontal driving current line. The second driving TFT can be connected to the second switching TFT and the second horizontal driving current line. The third driving TFT can be connected to the third switching TFT and the first horizontal driving current line. The fourth driving TFT can be connected to the fourth switching TFT and the second horizontal driving current line.

For example, the organic light emitting diode display according to an embodiment of the present invention further includes a first organic light emitting diode, a second organic light emitting diode, a third organic light emitting diode, and a fourth organic light emitting diode. The first organic light emitting diode can be connected to the first driving TFT and disposed in the first subpixel region. The second organic light emitting diode can be connected to the second driving TFT and disposed in the second subpixel region. The third organic light emitting diode can be connected to the third driving TFT and disposed in the third subpixel region. The fourth organic light emitting diode can be connected to the fourth driving TFT and disposed in the fourth subpixel region.

For example, the organic light emitting diode display according to an embodiment of the present invention further includes a sensing line, a first horizontal sensing control line, a second horizontal sensing control line, a first vertical sensing control line, and a second vertical sensing control line. The sensing line can be interposed between the second and third data lines. The first horizontal sensing control line can pass through the first and third subpixel regions between the first and second horizontal scan lines. The second horizontal sensing control line can pass through the second and fourth subpixel regions between the first and second horizontal scan lines. The first vertical sensing control line and the second vertical sensing control line can connect the first and second horizontal sensing control lines between the first and second vertical scan lines.

For example, the first horizontal sensing control line, the second horizontal sensing control line, the first vertical sensing control line, and the second vertical sensing control line can be in a closed loop shape having an end portion which is connected to one another and extends.

For example, the organic light emitting diode display according to an embodiment of the present invention further includes a first horizontal sensing line, a second horizontal sensing line, a third horizontal sensing line, and a fourth horizontal sensing line which are disposed between the first horizontal sensing control line, the second horizontal sensing control line, the first vertical sensing control line, and the second vertical sensing control line. The first horizontal sensing line can be branched from the sensing line into the first subpixel region. The second horizontal sensing line can be branched from the sensing line into the second subpixel region. The third horizontal sensing line can be branched from the sensing line into the third subpixel region. The fourth horizontal sensing line can be branched from the sensing line into the fourth subpixel region.

For example, the organic light emitting diode display according to an embodiment of the present invention further includes a first sensing TFT, a second sensing TFT, a third sensing TFT, and a fourth sensing TFT. The first sensing TFT can be connected to the first horizontal sensing control line and the first horizontal sensing line. The second sensing TFT can be connected to the second horizontal sensing control line and the second horizontal sensing line. The third sensing TFT can be connected to the first horizontal sensing control line and the third horizontal sensing line. The fourth sensing TFT can be connected to the second horizontal sensing control line and the fourth horizontal sensing line.

For example, the first and second horizontal scan lines can be disposed on a layer on which the scan line is disposed. The first and second vertical scan lines can be disposed on a layer on which the first to fourth data lines are disposed. An insulation film is interposed between the first and second horizontal scan lines and the first and second vertical scan lines. The first and second horizontal scan lines and the first and second vertical scan lines can be connected via scan contact holes formed in the insulation film.

For example, the organic light emitting diode display according to an embodiment of the present invention further includes a first scan contact hole, a second scan contact hole, a third scan contact hole, and a fourth scan contact hole. The first scan contact hole can connect the first horizontal scan line and the first vertical scan line. The second scan contact hole can connect the second horizontal scan line and the first vertical scan line. The third scan contact hole can connect the first horizontal scan line and the second vertical scan line. The fourth scan contact hole can connect the second horizontal scan line and the second vertical scan line.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
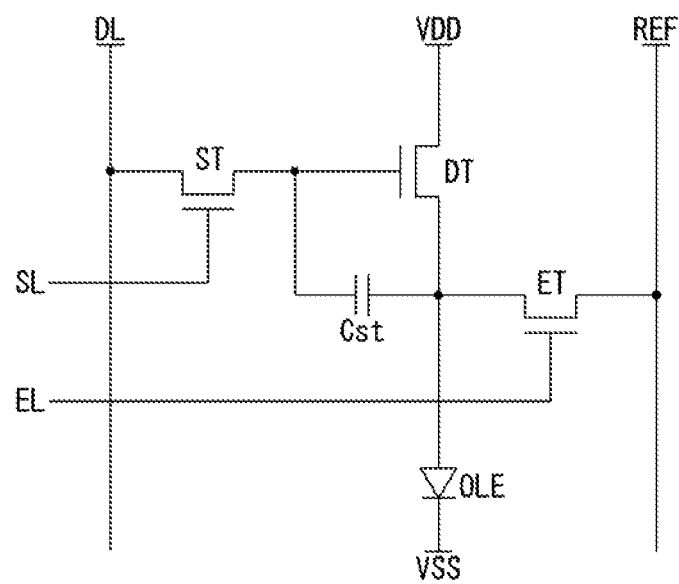
FIG. 1 is an example of an equivalent circuit showing a structure of one pixel in an organic light emitting diode display which is provided with a compensation circuit according to an embodiment of the present invention.

Hereinafter, exemplary embodiments of this invention will be described in detail with reference to the accompanying drawings, wherein same reference numerals can be used to denote the same or substantially the same elements throughout the specification and the drawings. In the following description, well-known functions or constructions related to this disclosure are not omitted if they would obscure gist of this disclosure in unnecessary. The terms for constituting elements used in the descriptions below have been chosen only for the purpose of convenience of documenting the invention, and thus, the terms can be different from those for actual product. In describing positional relationship, such as "an element A on an element B," "an element A above an element B," "an element A below an element Bi" and "an element A next to an element B," another element C can be disposed between the elements A and B unless the term "directly" or "immediately" is explicitly used.

Hereinafter, the present invention will be described with reference to FIG. 1. FIG. 1 is an example of an equivalent circuit showing a structure of one pixel in an organic light emitting diode display which is provided with a compensation circuit according to an embodiment of the present invention. Although one pixel is described, each or some of the pixels of the organic light emitting diode display can have the same configuration and structure as this one pixel. Further, all the components of the organic light emitting diode display according to all embodiments of the present invention are operatively coupled and configured.

Referring to FIG. 1, one pixel of the organic light emitting diode display can include a switching Thin Film Transistor (TFT) ST, a driving TFT DT, a storage capacitor Cst, a compensation circuit, and an organic light emitting diode OLE. The compensation circuit can be configured in various ways. In this embodiment, there is described a case where the compensation circuit is provided with a sensing TFT ET, a sensing line REF, and a sensing control line EL.

In response to a scan signal supplied via a scan line SL, the switching TFT ST performs a switching operation so that a data signal supplied via a data line DL is stored in the storage capacitor Cst as a data voltage. The driving TFT DT operates so that a driving current flows between a power line VDD and a base line VSS in response to the data voltage stored in the storage capacitor Cst. The organic light emitting diode OLE operates to emit light in response to the driving current formed by the driving TFT DT.

The sensing TFT ET is a circuit that is added in a pixel in order to compensate for a threshold voltage of the driving TFT DT. The sensing TFT ET is connected to a drain electrode of the driving TFT DT and an anode electrode (or a sensing node) of the organic light emitting diode OLE. The sensing TFT ET is activated by the sensing control line EL. The sensing TFT ET operates so as to supply an initialization voltage (or a sensing voltage) transferred via the sensing line REF to the sensing node or sense (detect) a voltage or a current of the sensing node.

A source electrode of the switching TFT ST is connected to the data line DL, and a drain electrode thereof is connected to a gate electrode of the driving TFT DT. A source electrode of the driving TFT DT is connected to the power line VDD, and a drain electrode thereof is connected to the anode electrode of the organic light emitting diode OLE. A first electrode of the storage capacitor Cst is connected to the gate electrode of the driving TFT DT, and a second electrode thereof is connected to the drain electrode of the driving TFT DT.

The anode electrode of the organic light emitting diode OLE is connected to the drain electrode of the driving TFT DT, and a cathode electrode is connected to the base line VSS. The gate electrode of the sensing transistor TFT ET is connected to the sensing control line EL, the source electrode thereof connected to the sensing line REF, and the drain electrode thereof connected to the anode electrode of the organic light emitting diode which is a sensing node.

An operation time of the sensing TFT ET can be similar or different to an operation time of the switching TFT ST depending on a compensation algorithm. In one example, as shown in FIG. 1, the gate electrode of the switching TFT ST can be connected to the scan line SL, while the gate electrode of the sensing TFT ET can be connected to the sensing control line EL. In another example, the gate electrode of the switching TFT ST and the gate electrode of the sensing TFT ET can be connected to each other so as to be shared on the scan line SL.

FIG. 1 is described by taking an example of a pixel in a 3T1C (three transistors, one capacitor) structure which includes a switching TFT ST, a driving TFT DT, a storage capacitor Cst, an organic light emitting diode OLE, and a sensing TFT ET. If another compensation circuit is further added, a pixel can be in a 3T2C, 4T2C, 5T1C, or 6T2C structure.

Hereinafter, there is described structural characteristics of a large-screen and/or super-resolution organic light emitting diode display according to one or more embodiments of the present invention, which is implemented with a circuit configuration described with reference to FIG. 1.

First Embodiment

Figure 2:
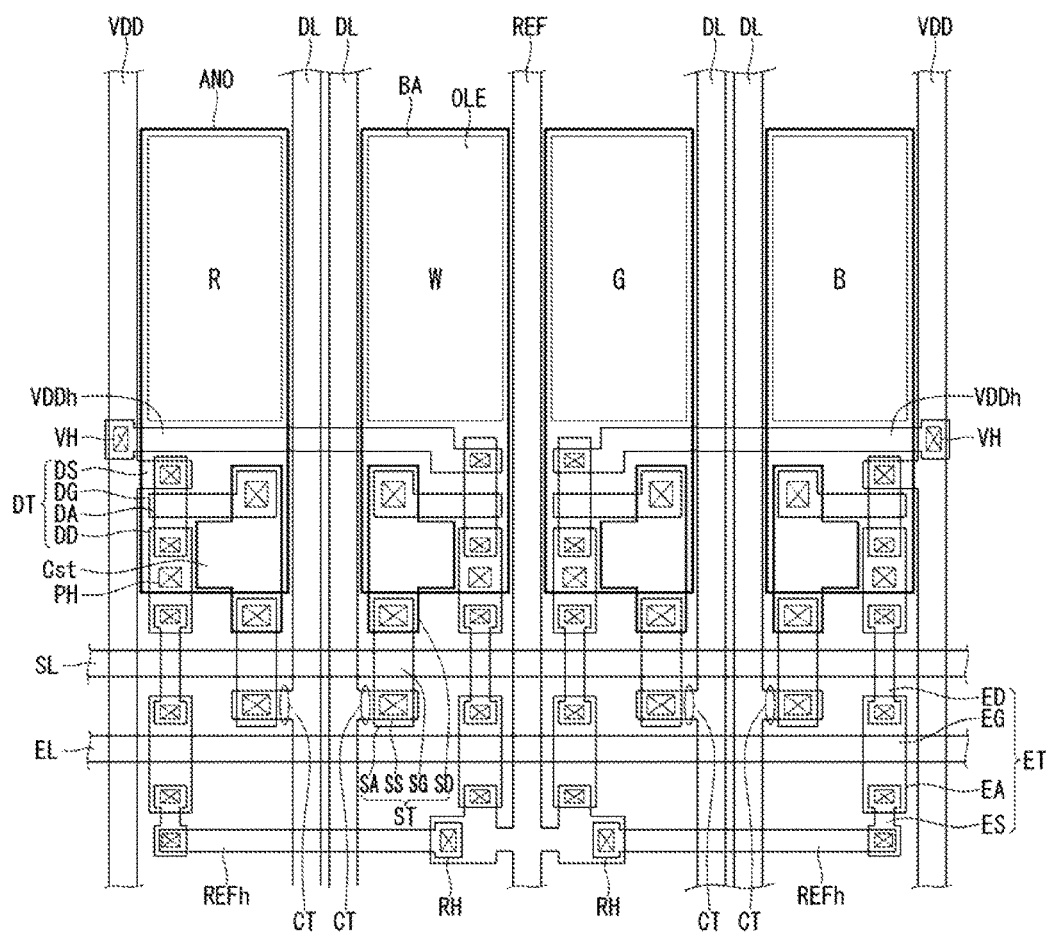
FIG. 2 is a plan view illustrating a structure of an organic light emitting diode display which is provided with a compensation TFT according to a first embodiment of the present invention.

Referring to FIG. 2, a first embodiment of the present invention will be described. FIG. 2 is a plan view illustrating a structure of an organic light emitting diode display which is provided with a compensation TFT according to the first embodiment of the present invention.

A pixel region in the organic light emitting diode display according to the first embodiment of the present invention is defined by a sensing line REF of a longitudinal direction (or a column direction or a vertical direction), a data line DL, and a driving current line VDD, and by a horizontal sensing line REFh of a transverse direction (or a row direction or a horizontal direction), a horizontal current line VDDh, a scan line SL, and a sensing control line EL. Specifically, a space positioned in a horizontal direction between two neighboring lines REFh and in a vertical direction between the driving current line VDD and the data line DL or between the sensing line REF and the data line DL is defined as one pixel region.

The scan line SL, the sensing control line EL, the horizontal sensing line REFh, and the horizontal current line VDDh run in a transverse direction of a substrate. The data line DL, the driving current line VDD, and the sensing line REF run in a longitudinal direction of a substrate. The horizontal sensing line REFh is connected via a sensing contact hole RH to the sensing line REF running in the vertical direction. The horizontal current line VDDh is connected via a current contact hole VH to the driving current line VDD running in the vertical direction.

In the organic light emitting diode display according to the first embodiment, four color subpixels of red (R), white (W), green (G), and blue (B) consecutively aligned in a row direction constitute a unit pixel. Unit pixels each composed of the four subpixels are repeatedly aligned. A unit pixel is defined between two neighboring horizontal sensing line REFh and between two neighboring driving current lines VDD.

Two sets of four subpixels are arranged on the left side and the right side of the sensing line REF. The sets of four subpixels are vertically symmetric with reference to the sensing line REF. The horizontal sensing line REFh is branched from or connected to the sensing line REF, and extends into two subpixel regions on the left side and two subpixel regions on the right side.

In a pixel region, a space between the horizontal driving current line VDDh and the horizontal sensing line REFh is defined as a non-emission region in which TFTs and a storage capacitor are arranged. Between the horizontal driving current line VDDh and a front-end horizontal sensing line REFh, an anode electrode ANO of the organic light emitting diode OLE is disposed. An emission region of the anode electrode ANO is defined by a bank BA, and the organic light emitting diode OLE is formed in the emission region.

The switching TFT ST includes a switching source electrode SS connected to the data line DL, a switching gate electrode SG which is part of the scan line SL, a switching semiconductor layer SA, and a switching drain electrode SD. A region in which the switching semiconductor layer SA and the switching gate electrode SG overlap is a channel region (a shaded portion). The switching TFT ST is formed as the switching semiconductor layer SA is disposed to cross from the lower side edge to the upper side edge of the scan line SL.

The sensing TFT ET includes a sensing source electrode ES connected to the horizontal sensing line REFh, a sensing gate electrode EG which is part of the sensing control line EL, a sensing semiconductor layer EA, and a sensing drain electrode ED. A region in which the sensing semiconductor layer EA and the sensing gate electrode EG overlap is a channel region (a shaded portion). The sensing TFT ET is formed as the sensing semiconductor layer EA is disposed to cross from the lower side to the upper side edge of the sensing control line EL.

The driving TFT DT includes a driving source electrode DS which is branched from the driving current line VDD or which is part of the horizontal current line VDDh, a driving gate electrode DG connected to the switching drain electrode SD, a driving semiconductor layer DA, and a driving drain electrode DD. A region in which the driving semiconductor layer DA and the driving gate electrode DG is a channel region (a shaded portion). The driving semiconductor layer DA starts from the driving source electrode DS and crosses the driving agate electrode DG to extend in a direction toward the scan line SL. The driving drain electrode DD is connected to one side of the driving semiconductor layer DA and the sensing drain electrode ED.

The storage capacitor Cst includes a first electrode and a second electrode. The first electrode is formed as an expanded part of the switching drain electrode SD. The second electrode can be formed as part of the driving drain electrode DD or the anode electrode ANO. In this embodiment, for convenience of explanation, there is illustrated the case where part of the anode electrode is configured as a second electrode overlapping the first electrode.

The driving TFT DT and the storage capacitor Cst are disposed between the horizontal current line VDDh and the scan line SL. In addition, the switching TFT ST and the sensing TFT ET are disposed between the scan line SL and the horizontal sensing line REFh. In conclusion, driving elements are disposed between the horizontal current line VDDh and the horizontal sensing lines REFh, and a region where the driving element are disposed is defined as a non-emission region. The anode electrode ANO is in a structure that extends from an emission region to part of the non-emission region.

The anode electrode ANO of the organic light emitting diode OLE is connected to the driving drain electrode DD via a pixel contact hole PH. An opening of a bank BA is formed so as to expose the maximum area of the emission region in the anode electrode ANO.

Due to the bank BA, part of the anode electrode ANO is exposed. As an organic light emitting layer and a cathode electrode are sequentially deposited on the anode electrode ANO and the bank BA, the organic light emitting diode OLE is formed. Preferably, the organic light emitting diode OLE is formed to have the maximum area in the emission region.

The organic light emitting diode display shown in FIG. 2 is in a structure in which an opening region of the bank BA does not overlap with the TFTs ST, DT, and ET. This case is about a structure of a bottom emission-type organic light emitting diode display. To implement an organic light emitting diode display as a top emission type, the TFTs ST and DT and even the region of the anode electrode ANO overlapping with the storage capacitor Cst can be included in the opening region. Further more, the anode electrode ANO can extend until the horizontal sensing line REFh, and the sensing TFT ET can be included in the opening region of the bank BA.

If a defect occurs in any one pixel of an organic light emitting diode display having the structure shown in FIG. 2, a corresponding defective pixel is darkened not to be recognized by a user. That is, the defective pixel is controlled not to operate nor emit any color, so that operation of the defective pixel is not recognized by the user.

Blocking connection of the switching TFT ST to the data line DL is one way of darkening a pixel. If a cutting portion is configured in the switching source electrode SS connected to the data line DL, a predetermined interval is required not to affect other neighboring devices. For example, to cut the switching source electrode SS, an interval of 23 µm from a neighboring device is required. To this end, a larger non-opening region is needed, and this can lead to degradation of an opening ratio.

Another way of blocking the connection, cutting the switching gate electrode SG of the switching TFT ST connected to the scan line SL can be considered. The switching gate electrode SG is already spaced apart a sufficient distance from neighboring devices, and thus, a minimum distance of 23 µm from the neighboring devices is secured sufficiently.

In the structure as shown in FIG. 2, the switching gate electrode SG is not branched from the scan line SL, and part of the scan line SL is used as the switching gate electrode SG. In this case, by cutting the left side and the right side of the scan line SL of the switching TFT ST, it is possible to make the switching TFT ST disable to operate. However, the scan line SL crossing the entire region of the substrate is disconnected so a scan line is not transmitted to other switching TFTs connected to the same scan line SL. In the structure shown in FIG. 2, a disconnected portion for pixel repair cannot be defined in the scan line SL.

In order for the switching gate electrode SG to have a cutting portion, the switching gate electrode SG needs to be in a form of being separating from the scan line SL, unlike FIG. 2, so that the switching gate electrode SG is able to be disconnected from the scan line SL. However in this structure, the switching gate electrode SG needs to be in the form of being branched from the scan line SL, so there are problems that a larger size of a non-opening region is required and the opening ratio is degraded. Thus, in order to darken a defective pixel in the first embodiment shown in FIG. 2, a structure in which the source electrode SG of the switching TFT ST is able to be selectively disconnected from the data line DL is required. That is, for the bottom emotion-type organic light emitting diode display shown in FIG. 2, it is difficult to secure an opening ratio.

Hereinafter, in a second embodiment, a new structure of an organic light emitting diode display capable of securing a high opening ratio will be described. In addition, an organic light emitting diode display capable of securing a high opening ratio, regardless of application of a top emission type and a bottom emission type, and capable of maintaining connectivity of a scan line despite cutting of the scan line will be described.

Second Embodiment

Figure 3:
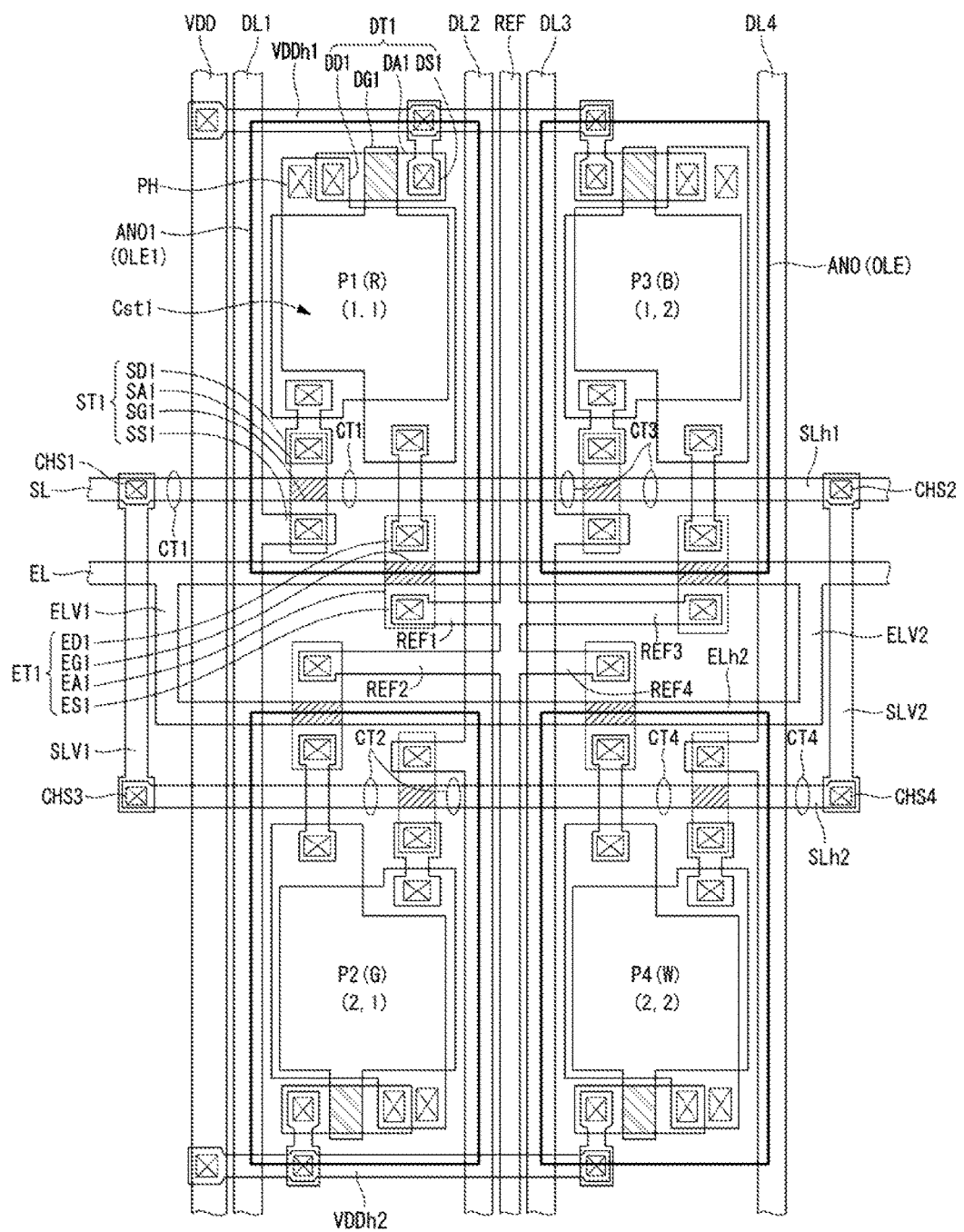
FIG. 3 is a plan view illustrating a structure of an organic light emitting diode display which is provided with a compensation TFT according to a second embodiment.

In the second embodiment, there is provided an organic light emitting diode display in a structure in which darkening of a defective pixel is able to be done by cutting the left side and the right side of a switching TFT on a scan line. Hereinafter, the second embodiment of the present invention will be described with reference to FIGS. 1 and 3. FIG. 3 is a plan view illustrating a structure of an organic light emitting diode display which is provided with a compensation TFT according to the second embodiment.

First, referring to FIG. 3, the structure of the plan view of the organic light emitting diode display according to the second embodiment of the present invention will be described. The organic light emitting diode display according to the second embodiment of the present invention includes four subpixel regions arranged in a 2×2 matrix. The four subpixel regions arranged in a 2×2 matrix constitute one unit pixel. For example, a first subpixel region P1 is arranged at (1,1) in the matrix. A second subpixel region P2 is arranged at (2,1) in the matrix. A third subpixel region P3 is arranged at (1,2) in the matrix. A fourth subpixel region P4 is arranged at (2,2) in the matrix.

The four subpixel regions P1 to P4 are combined to define one single pixel region. For example, a red (R) pixel can be allocated to the first subpixel region P1, a green (G) pixel can be allocated to a second subpixel region P2, a blue (B) pixel can be allocated to the third subpixel region P3, and a white (W) pixel can be allocated to the fourth subpixel region P4. As a result, one single pixel region having RGBW can be formed in a 2×2 structure.

In order to define a 2×2 single pixel region, a first data line DL1, a second data line DL2, a third data line DL3, and a fourth data line DL4, which cross over a substrate in a longitudinal direction, are included. In addition, a driving current line VDD is disposed an outer side, that is, the left side, of the first data line DL1. As another way, the driving current line VDD can be disposed on an outer right side of the fourth data line DL4.

A first horizontal driving current line VDDh1 connected to the driving current line VDD and extending to the first subpixel region P1 and the third subpixel region P3 is disposed on upper side edges of the first subpixel region P1 and the third subpixel region P3. In addition, a second horizontal driving current line VDDh2 connected to the driving current line VDD and extending to the second subpixel region P2 and the fourth subpixel region P4 is disposed on lower side edges of the second subpixel region P2 and the fourth subpixel region P4.

The first subpixel region P1 and a second subpixel region P2 are disposed in a row direction between a first data line DL1 and a second data line DL2. The third subpixel region P3 and the fourth subpixel region P4 are disposed in a row direction between the third data line DL3 and the fourth data line DL4.

A first horizontal scan line SLh1 passes through in a transverse direction on lower side edges of the first subpixel region P1 and the third subpixel region P3. A second horizontal scan line SLh2 passes through in a transverse direction on upper side edges of the second subpixel region P2 and the fourth subpixel region P4. The first horizontal scan line SLh1 and the second horizontal scan line SLh2 are in the form of a segment which passes through the central portion of the 2×2 single pixel region in the transverse direction.

Both ends of the first horizontal scan line SLh1 and the second horizontal scan line SLh2 are connected to each other by the first vertical scan line SLv1 and the second vertical scan line SLv2. For example, the first vertical scan line SLv1 is disposed along the left side edges of the first subpixel region P1 and the second subpixel region P2, and the second vertical scan line SLv2 is disposed along the right side edges of the third subpixel region P3 and the fourth subpixel region P4.

The first horizontal scan line SLh1, the second horizontal scan line SLh2, the first vertical scan line SLv1, and the second vertical scan line SLv2 are connected to each other to form a closed-loop or closed-curve shape. A close loop shape is formed at every 2×2 matrix unit. The closed-curve shape is connected in the transverse direction by one scan line SL. For example, the scan line SL is connected by any one of the first horizontal scan line SLh1 and the second horizontal scan line SLh2, and extends in the transverse direction on a substrate.

Between the first horizontal scan line SLh1 and the second horizontal scan line SLh2, there are disposed a first horizontal sensing control line ELh1 passing through the first subpixel region P1 and the third subpixel region P3 and a second horizontal sensing control line ELh2 passing through the second subpixel line P2 and the fourth subpixel region P4. Furthermore, between the first vertical scan line SLv1 and the second vertical scan line SLv2, there are disposed a first vertical sensing control line ELv1 and a second vertical sensing control line ELv2 which connect the first horizontal sensing control line ELh1 and the second horizontal sensing control line ELh2.

Both ends of the first horizontal sensing control line ELh1, the second horizontal sensing control line ELh2, the first vertical sensing control line ELv1, and the second vertical sensing control line ELv2 are connected to each other to form a closed loop shape or a closed curve shape. The closed curve shape is formed at every 2×2 matrix unit. The closed curve shape is connected in the transverse direction by one sensing control line EL. For example, the sensing control line EL can be connected to any one of the first horizontal sensing control line ELh1 and the second horizontal sensing control line ELh2, and extend in the transverse direction on a substrate.

In addition, a sensing line REF is disposed between a second data line DL2 and a third data line DL3. A first horizontal sensing line REF1, a second horizontal sensing line REF2, a third horizontal sensing line REF3, and a fourth horizontal sensing line REF4 are disposed in an inner space surrounded by the first horizontal sensing control line ELh1, the second horizontal sensing control line ELh2, the first vertical sensing control line ELv1, and the second vertical sensing control line ELv2.

The first horizontal sensing line REF1 is branched from the sensing line REF into the first subpixel region P1. The second horizontal sensing line REF2 is branched from the sensing line REF into the second subpixel region P2. The third horizontal sensing line REF3 is branched from the sensing line REF into the third subpixel region P3. The fourth horizontal sensing line REF4 is branched from the sensing line REF into the fourth subpixel region P4.

In the first subpixel region P1, there are disposed a first scan TFT ST1, a first sensing TFT ET1, a first driving TFT DT1, and a first storage capacitor Cst1. The first scan TFT ST1 is connected to the first horizontal scan line SLh1 and the first data line DL1.

For example, the first scan TFT ST1 includes a first scan source electrode SS1, a first scan gate electrode SG1, a first scan semiconductor layer SA1, and a first scan drain electrode SD1. The first scan source electrode SS1 is branched from the first data line DL1. The first scan gate electrode SG1 is defined as a partial region of the first horizontal scan line Slh1. For example, a region overlapping the first scan semiconductor layer SA1 and the first horizontal scan line SLh1 is defined as the first scan gate electrode SG1. A region of the first scan semiconductor layer SA1 overlapping with the first scan gate electrode SG1 is defined as a channel region. The first scan drain electrode SD1 opposes the first scan source electrode SS1. One side of the first scan semiconductor layer SA1 is connected to the first scan source electrode SS1, and the other side thereof is connected to the first scan drain electrode SD1.

The first sensing TFT ET1 is connected to the first horizontal sensing control line ELh1 and the first horizontal sensing line REF1. For example, the first sensing TFT ET1 includes a first sensing source electrode ES1, a first sensing gate electrode EG1, a first sensing semiconductor layer EA1, and a first sensing drain electrode ED1. The first sensing source electrode ES1 is branched from or connected to the first horizontal sensing line REF1. The first sensing gate electrode EG1 is defined as a partial region of the first horizontal sensing control line ELh1. For example, a region overlapping the first sensing semiconductor layer EA1 and the first horizontal sensing control line ELh1 is defined as the first sensing gate electrode EG1. A region of the first sensing semiconductor layer EA1 overlapping with the first sensing gate electrode EG1 is defined as a channel region. The first sensing drain electrode ED1 opposes the first sensing source electrode ES1. One side of the first sensing semiconductor layer EA1 is connected to the first sensing source electrode ES1, and the other side thereof is connected to the first sensing drain electrode ED1.

The first driving TFT DT1 is connected to the first scan TFT ST1 and the first horizontal driving current line VDDh1. For example, the first driving TFT DT1 includes a first driving source electrode DS1, a first driving gate electrode DG1, a first driving semiconductor layer DA1, and a first driving drain electrode DD1. The first driving source electrode DS1 is branched from or connected to the first horizontal driving current line VDDh1. The first driving gate electrode DG1 is formed as an extended portion of the first switching drain electrode SD1. The first driving drain electrode DD1 is connected to the first sensing drain electrode ED1 or formed as one body with the first sensing drain electrode ED1. One side of the first driving semiconductor layer DA1 is connected to the first driving source electrode DS1, and the other side thereof is connected to the first driving drain electrode DD1.

The first storage capacitor Cst1 is provided with a first electrode and a second electrode. The first electrode is in an extended shape of a first driving gate electrode DG1 connected to the first switching drain electrode SD1 of the first switching TFT ST1. The second electrode is in an extended shape of the first driving drain electrode DD1 and connected to the first sensing drain electrode ED1 of the first sensing TFT ET1.

A first organic light emitting diode OLE1 is disposed in the first subpixel region P1. A first anode electrode ANO1 is connected to the first driving drain electrode DD1. A first organic light emitting layer and a cathode electrode CAT are deposited on the first anode electrode ANO1 to form the first organic light emitting diode OLE1. The organic light emitting layer can be disposed separately at each subpixel or can be formed as one single layer over all subpixel regions. In addition, the cathode electrode is in a structure which allows the cathode electrode to be deposited while coming into contact with all organic light emitting layers disposed at different subpixel regions. Thus, the cathode electrode CAT is formed as one body, without being separated at each subpixel region.

TFTs, storage capacitors, and organic light emitting diodes are disposed on each of the second subpixel region P2, the third subpixel region P3, and the fourth subpixel region P4 in the same manner as they do on the first subpixel region P1. The components have the same structure as they do on the first subpixel region P1 and connected in the same manner as they do on the first subpixel region P1, and thus, any redundant description will be omitted.

Preferably, the first vertical scan line SLv1 and the second vertical scan line SLv2 are formed on a layer different from a layer on which the first horizontal scan line SLh1 and the second horizontal scan line SLh2 are formed. In one example, the first vertical scan line SLv1 and the second vertical scan line SLv2 can be formed on a layer on which data lines DL running in a longitudinal direction over a substrate and can be formed of the same metal material as that of the data lines DL. In another example, the first vertical scan line SLv1 and the second vertical scan line SLv2 can be formed on a light shielding layer which is formed below a semiconductor layer. If a conductive material is used in the semiconductor layer, it is desirable to form the first vertical scan line SLv1 and the second vertical scan line SLv2 with the same material as that of the light shielding layer.

More specifically, the first horizontal scan line SLh1 and the second horizontal scan line SLh2 can be disposed on a layer on which the scan line SL is disposed. The first vertical scan line SLv1 and the second vertical scan line SLv2 can be disposed on a layer on which the first to fourth data lines DL1 to Dl4 are disposed. An insulation film is interposed between the first and second horizontal scan lines SLh1 and SLh2 and the first and second vertical scan lines SLv1 and SLv2. The first and second horizontal scan lines SLh1 and SLh2 and the first and second vertical scan lines SLv1 and SLv2 are connected through scan contact holes CHS1 to CHS4 formed in the insulation film.

The scan contact holes include a first scan contact hole CHS1, a second scan contact hole CHS2, a third contact hole CHS3, and a fourth contact hole CHS4. The first scan contact hole CHS1 connects the first horizontal scan line SLh1 and the first vertical scan line SLv1. The second scan contact hole CH2 connects the first horizontal scan line SLh1 and the second vertical scan line SLv2. The third scan contact hole CHS3 connects the second horizontal scan line SLh2 and the first vertical scan line SLv1. The fourth scan contact hole CHS4 connects the second horizontal scan line SLh2 and the second vertical scan line SLv2.

According to the second embodiment of the present invention, a scan line is disposed with a closed loop shape in four subpixel regions arranged in a 2×2 matrix. Thus, when an error occurs in any one subpixel, it is possible to selectively darken a corresponding defective pixel by disconnecting a portion of a close loop-shaped scan line.

For example, as shown in FIG. 3, cutting portions can be defined in the left side and the right side of each of the first switching TFT ST1, the second switching TFT ST2, the third switching TFT ST3, and the fourth switching TFT ST4. For example, first cutting portions CT1 can be configured on each of the left side and the right side of the first switching TFT ST1 from the first horizontal scan line SLh1. In addition, third cutting portion CT2 can be formed in the left side and the right side of the third switching TFT ST3 from the first horizontal scan line SLh1. Similarly, second cutting portions CT2 can be formed in the left side and the right side of the second switching TFT ST2 from the second horizontal scan line SLh2. In addition, fourth cutting portions CT4 can be formed in the left side and the right side of the fourth switching TFT ST4 from the second horizontal scan line SLh2.

If an error occurs in the first switching TFT ST1, it is possible to disable the first switching TFT transistor ST1 by cutting the first cutting portions CT1. As a result, a pixel disposed in the first subpixel region P1 is darkened. Even when part of the first horizontal scan line SLh1 is cut, the second, third, and fourth switching TFTs ST2, ST3, and ST4 disposed in other three subpixel regions P2, P3, and P4 can operate normally due to the first vertical scan line SLv1 and the second vertical scan line SLv2.

In the organic light emitting diode display according to the second embodiment of the present invention, subpixels arranged in a 2×2 matrix constitute one unit pixel and a plurality of unit pixels are disposed in a matrix form. A 2×2 unit pixel has an upper side edge and a lower side edge defined by the first horizontal driving current line VDDh1 and the second horizontal driving current line VDDh2, respectively, and a left side edge and a right side edge defined by the first vertical scan line Svh1 and the second vertical scan line Svh2, respectively. In addition, a 2×2 unit pixel has an upper side edge and a lower side edge defined by the first horizontal driving current line VDDh1 and the second horizontal driving current line VDDh2, and a left side edge and a right side edge defined by two neighboring driving current lines VDD.

In particular, there is provided a closed loop-shaped scan line connecting subpixels which are arranged in a 2×2 matrix. By disconnecting a section of the closed loop-shaped scan line which passes through one of the subpixels arranged in the 2×2 matrix, it is possible to selectively darken a corresponding pixel without affecting other pixels.

In addition, switching TFTs of the subpixels arranged in the 2×2 matrix use part of a scan line as a switching gate electrode, and thus, a section of the scan line which corresponds to a switching gate electrode in a darkening process can be defined as a cut-off region. Thus, it is possible to set a disconnected region for darkening, without causing degradation of an opening ratio. In particular, to implementing super resolution, a disconnected region is set without causing degradation of an opening ratio, so that a super-resolution organic light emitting diode with a high opening ratio can be provided. The organic light emitting diode display according to the second embodiment of the present invention can be applied both of the top emission type and the bottom emission type.

Third Embodiment

Figure 4:
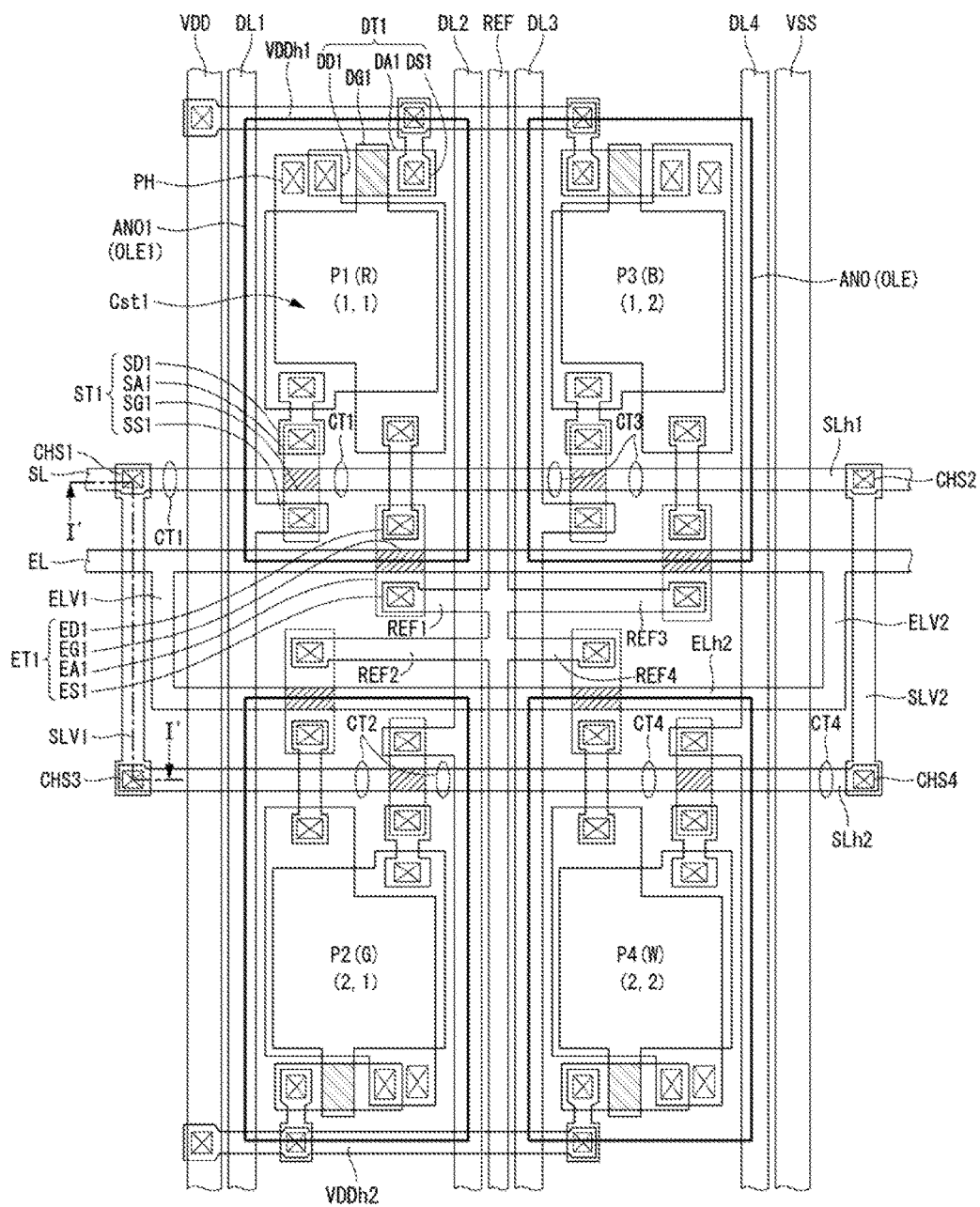
FIG. 4 is a plan view illustrating a structure of an organic light emitting diode display which is provided with a compensation TFT according to a third embodiment of the present invention.

Hereinafter, a third embodiment of the present invention will be described with reference to FIGS. 1 and 4. FIG. 4 is a plan view illustrating a structure of an organic light emitting diode display which is provided with a compensation TFT according to the third embodiment of the present invention.

Most of all components of the organic light emitting diode display according to the third embodiment are similar to those of the organic light emitting diode display according to the second embodiment. However, the organic light emitting diode display according to the third embodiment further includes a base line VSS. The base line VSs is an additional line connected to a cathode electrode. For a bottom emission type, it is desirable that an anode electrode ANO is formed of a transparent conductive material and a cathode electrode is formed of a non-transparent metal material. Thus, since the cathode electrode formed of a metal material covers the entire region of a substrate, it is not necessary to additionally form the base line VSS inside the substrate.

However, for a top emission-type, it is desirable that an anode electrode ANO is formed of a non-transparent metal material and a cathode electrode is formed of a transparent conductive material. The cathode electrode can include a transparent conductive material, such as ITO and IZO, and suck a material has relatively great non-resistance compared to a metal material. Thus, when a large-screen organic light emitting diode display is formed as a top emission-type, it is difficult to maintain a voltage of the cathode electrode at a constant level. To solve this problem, it is desirable to provide a base line VSS, which includes a non-transparent metal material, inside a substrate.

The organic light emitting diode display according to the third embodiment of the present invention relates to a top emission type and further includes a base line VSS for reduce surface resistance of a cathode electrode. In particular, if a base line VSS running in a longitudinal direction is disposed on one side edge of a 2×2 subpixel matrix, the organic light emitting diode display has a structure in which one base line VSS is disposed every two subpixel column.

Referring to FIG. 3, the organic light emitting diode display according to the third embodiment of the present invention is in a structure in which subpixels arranged in a 2×2 matrix constitute one unit pixel and a plurality of unit pixels is arranged in a matrix form. A 2×2 unit pixel has an upper side edge and a lower side edge respectively defined by the first horizontal driving current line VDDh1 and the second horizontal driving current line VDDh2, and a left side edge and a right side edge respectively defined by the first vertical scan line SLv1 and the second vertical scan line SLv2. Alternatively, a 2×2 unit pixel has an upper side edge and a lower side edge respectively defined by the first horizontal driving current line VDDh1 and the second horizontal driving current line VDDh2, and a left side edge and a right side edge defined by the driving current line VDD and the base line VSS.

Figure 5:
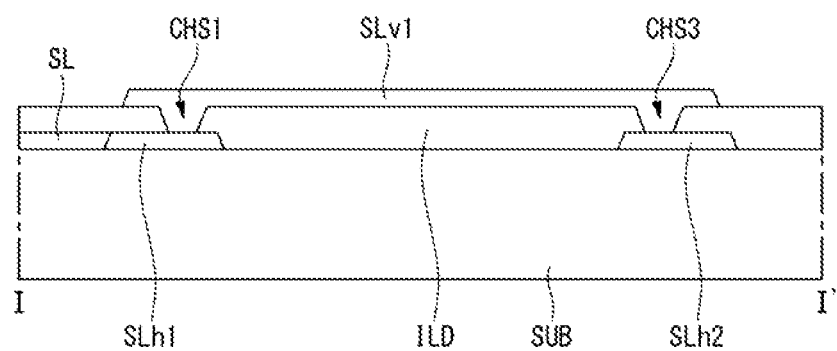
FIG. 5 is a cross-sectional view showing a connection structure of a horizontal scan line and a vertical scan line described with reference to the second and third embodiments of the present invention.

Hereinafter, referring to FIG. 5, a connection structure of a horizontal scan line and a vertical scan line described with reference to the second and third embodiments of the present invention will be described with reference to FIG. 5. FIG. 5 is a cross-sectional view cut along line I-I' of FIG. 4.

On a substrate SUB, the first horizontal scan line SLh1 and the second horizontal scan line SLh2 are formed on a plane on which a scan line SL is formed. For example, the first horizontal scan line SLh1 can extend from the scan line SL. Meanwhile, the second horizontal scan line SLh2 is spaced apart a predetermined distance from the first horizontal scan line SLh1. The scan line SL, the first horizontal scan line SLh1, and the second horizontal scan line SLh3 are covered by an insulation film ILD. In the insulation film ILD, there are formed a first scan contact hole CHS1 exposing one side end of the first horizontal scan line SLh1 and a third scan contact hole CHS3 exposing one side end of the second horizontal scan line SLh2.

On the insulation film ILD, there are formed the first vertical scan line SLv1 and the second vertical scan line SLv2, in addition to a data line. The first vertical scan line SLv1 is connected to the first horizontal scan line SLh1 via the first scan contact hole CHS1. In addition, the first vertical scan line SLv1 is connected to the second horizontal scan line SLh2 via the third scan contact hole CHS3.

The organic light emitting diode display according to one or more embodiments of the present invention is provided with a close loop-shaped scan line which passes through subpixels arranged in a 2×2 matrix at the same time in a structure in which the subpixels arranged in a 2×2 matrix is defined as one pixel. If a defect occurs in any one of the subpixels arranged in a 2×2 matrix, it is possible to selectively darken a defective pixel by selectively disconnecting a defective pixel section of a scan line. Even though one section of the scan line is cut off, it is possible to properly transmit a scan signal to other normal pixels. As a result, a large-screen and/or super-resolution organic light emitting diode display capable of selectively darkening a defective pixel while securing a high opening ratio can be provided.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display comprising:
   a first subpixel region at (1,1), a second subpixel region at (2,1), a third subpixel region at (1,2), and a fourth subpixel region at (2,2) in a 2×2 matrix on a substrate;
   a first horizontal scan line passing through the first and third subpixel regions;
   a second horizontal scan line passing through the second and fourth subpixel regions; and
   a first vertical scan line and a second vertical scan line connecting the first horizontal scan line and the second horizontal scan line.

2. The organic light emitting diode display of claim 1, wherein the first vertical scan line is disposed along left side edges of the first and second subpixel regions, and wherein the second vertical scan line is disposed along right side edges of the third and fourth subpixel regions.

3. The organic light emitting diode display of claim 1, further comprising:
   a scan line connected to one of the first and second horizontal scan lines and extending in a transverse direction on the substrate;
   a first data line disposed on left side edges of the first and second subpixel regions on the substrate;
   a second data line disposed on right side edges of the first and second subpixel regions;
   a third data line disposed on left side edges of the third and fourth subpixel regions;
   a fourth data line disposed on right side edges of the third and fourth subpixel regions;
   a driving current line disposed in an outer side of one of the first and fourth data lines;
   a first horizontal driving current line connected to the driving current line and extending to the first and third subpixel regions; and
   a second horizontal driving current line connected to the driving current line and extending to the second and fourth subpixel regions.

4. The organic light emitting diode display of claim 3, further comprising:
   a first switching thin film transistor (TFT) connected to the first data line and the first horizontal scan line and disposed in the first subpixel region;
   a second switching TFT connected to the second data line and the second horizontal scan line and disposed in the second subpixel region;
   a third switching TFT connected to the third data line and the first horizontal scan line and disposed in the third subpixel region; and
   a fourth switching TFT connected to the fourth data line and the second horizontal scan line and disposed in the fourth subpixel region.

5. The organic light emitting diode display of claim 4, further comprising:
   first cutting portions defined in left and right sides of the first switching TFT on the first horizontal scan line in the first subpixel region;
   second cutting portions defined in left and right sides of the second switching TFT on the second horizontal scan line in the second subpixel region;
   third cutting portions defined in left and right sides of the third switching TFT on the first horizontal scan line in the third subpixel region; and
   fourth cutting portions defined in left and right sides of the fourth switching TFT on the second horizontal scan line in the fourth subpixel region.

6. The organic light emitting diode display of claim 4, further comprising:
   a first driving TFT connected to the first switching TFT and the first horizontal driving current line;
   a second driving TFT connected to the second switching TFT and the second horizontal driving current line;
   a third driving TFT connected to the third switching TFT and the first horizontal driving current line; and
   a fourth driving TFT connected to the fourth switching TFT and the second horizontal driving current line.

7. The organic light emitting diode display of claim 6, further comprising:
   a first organic light emitting diode connected to the first driving TFT and disposed in the first subpixel region;
   a second organic light emitting diode connected to the second driving TFT and disposed in the second subpixel region;
   a third organic light emitting diode connected to the third driving TFT and disposed in the third subpixel region; and
   a fourth organic light emitting diode connected to the fourth driving TFT and disposed in the fourth subpixel region.

8. The organic light emitting diode display of claim 6, further comprising:

a sensing line interposed between the second and third data lines;

a first horizontal sensing control line passing through the first and third subpixel regions between the first and second horizontal scan lines;

a second horizontal sensing control line passing through the second and fourth subpixel regions between the first and second horizontal scan lines; and a first vertical sensing control line and a second vertical sensing control line connecting the first and second horizontal sensing control lines between the first and second vertical scan lines.

9. The organic light emitting diode display of claim 8, wherein the first horizontal sensing control line, the second horizontal sensing control line, the first vertical sensing control line, and the second vertical sensing control line are in a closed loop shape having an end portion which is connected to one another and extends.

10. The organic light emitting diode display of claim 9, further comprising:

a first horizontal sensing line, a second horizontal sensing line, a third horizontal sensing line, and a fourth horizontal sensing line which are disposed between the first horizontal sensing control line, the second horizontal sensing control line, the first vertical sensing control line, and the second vertical sensing control line, wherein the first horizontal sensing line is branched from the sensing line into the first subpixel region, wherein the second horizontal sensing line branched from the sensing line into the second subpixel region, wherein the third horizontal sensing line branched from the sensing line into the third subpixel region, and wherein the fourth horizontal sensing line branched from the sensing line into the fourth subpixel region.

11. The organic light emitting diode display of claim 10, further comprising:

a first sensing TFT connected to the first horizontal sensing control line and the first horizontal sensing line;

a second sensing TFT connected to the second horizontal sensing control line and the second horizontal sensing line;

a third sensing TFT connected to the first horizontal sensing control line and the third horizontal sensing line; and a fourth sensing TFT connected to the second horizontal sensing control line and the fourth horizontal sensing line.

12. The organic light emitting diode display of claim 3, wherein the first and second horizontal scan lines are disposed on a layer on which the scan line is disposed, wherein the first and second vertical scan lines are disposed on a layer on which the first to fourth data lines are disposed, wherein an insulation film is interposed between the first and second horizontal scan lines and the first and second vertical scan lines, and wherein the first and second horizontal scan lines and the first and second vertical scan lines are connected via scan contact holes formed in the insulation film.

13. The organic light emitting diode display of claim 12, wherein the scan contact holes comprise:

a first scan contact hole connecting the first horizontal scan line and the first vertical scan line;

a second scan contact hole connecting the second horizontal scan line and the first vertical scan line;

a third scan contact hole connecting the first horizontal scan line and the second vertical scan line; and a fourth scan contact hole connecting the second horizontal scan line and the second vertical scan line.

* * * * *